United States Patent
Miyashita

(10) Patent No.: US 8,988,883 B2
(45) Date of Patent: Mar. 24, 2015

(54) ELECTRO-OPTIC DEVICE AND ELECTRONIC DEVICE

(75) Inventor: Tomoaki Miyashita, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 146 days.

(21) Appl. No.: 12/753,980

(22) Filed: Apr. 5, 2010

(65) Prior Publication Data

US 2010/0271782 A1 Oct. 28, 2010

(30) Foreign Application Priority Data

Apr. 27, 2009 (JP) ................................. 2009-107368

(51) Int. Cl.
| | | |
|---|---|---|
| H05K 7/20 | (2006.01) | |
| G03B 21/16 | (2006.01) | |
| G06F 1/20 | (2006.01) | |
| G02F 1/1333 | (2006.01) | |
| G02F 1/1335 | (2006.01) | |

(52) U.S. Cl.
CPC ............ H05K 7/20963 (2013.01); G03B 21/16 (2013.01); G06F 1/20 (2013.01); G02F 1/133382 (2013.01); G02F 1/133553 (2013.01); G02F 2001/133311 (2013.01); G02F 2001/133331 (2013.01)
USPC ...... 361/715; 361/679.21; 361/709; 361/728; 361/807; 361/831; 174/560; 349/58; 349/62; 362/373

(58) Field of Classification Search
CPC ............ H01L 23/4093; H01L 23/4006; H01L 23/467; H01L 23/3672; H01L 23/427; H01L 2023/405; H01L 2023/4081; H01L 2224/48091; G02F 1/133308; G02F 1/133608; G02F 1/13452; G02F 1/1345; G02F 1/13454
USPC ........................ 361/676–678, 679.46–679.54, 361/688–723, 752, 760, 799–802, 807, 809, 361/816, 818, 829, 831
See application file for complete search history.

(56) References Cited

U.S. PATENT DOCUMENTS

| | | | | |
|---|---|---|---|---|
| 5,146,354 | A * | 9/1992 | Plesinger | 349/59 |
| 5,299,038 | A * | 3/1994 | Hamada et al. | 349/161 |
| 5,406,399 | A * | 4/1995 | Koike | 349/58 |
| 5,659,376 | A * | 8/1997 | Uehara et al. | 349/58 |
| 5,721,602 | A * | 2/1998 | Narayan et al. | 349/161 |
| 5,742,366 | A * | 4/1998 | Imoto | 349/62 |
| 5,757,443 | A * | 5/1998 | Kobayashi | 349/5 |
| 5,818,564 | A * | 10/1998 | Gray et al. | 349/161 |
| 5,835,179 | A * | 11/1998 | Yamanaka | 349/161 |
| 6,069,677 | A * | 5/2000 | Kitai | 349/111 |
| 6,246,459 | B1 * | 6/2001 | Simhambhatla et al. | 349/149 |
| 6,359,721 | B1 * | 3/2002 | Fujimori | 359/246 |

(Continued)

FOREIGN PATENT DOCUMENTS

| | | |
|---|---|---|
| JP | 2002-189210 A | 10/2002 |
| JP | 2002-296568 A | 10/2002 |

(Continued)

*Primary Examiner* — Courtney Smith
(74) *Attorney, Agent, or Firm* — ALG Intellectual Property, LLC

(57) ABSTRACT

An electro-optic device includes an electro-optic panel, a first holding member that holds the electro-optic panel, and a second holding member provided with a heat emitting portion on the side opposite to a surface to which the electro-optic panel is adhered. In the electro-optic device, a predetermined gap is provided between the first holding member and the second holding member.

17 Claims, 5 Drawing Sheets

(56) References Cited

U.S. PATENT DOCUMENTS

| | | | | |
|---|---|---|---|---|
| 6,392,724 B2* | 5/2002 | An et al. | | 349/58 |
| 6,392,780 B1* | 5/2002 | Fujimori | | 359/246 |
| 6,414,781 B1* | 7/2002 | Saitoh | | 359/245 |
| 6,498,672 B2* | 12/2002 | Saitoh | | 359/245 |
| 6,549,320 B2* | 4/2003 | Fujimori | | 359/246 |
| 6,731,367 B1* | 5/2004 | Saitoh | | 349/158 |
| 6,737,790 B2* | 5/2004 | Seki | | 313/47 |
| 6,791,838 B1* | 9/2004 | Hung et al. | | 361/704 |
| 6,815,729 B1* | 11/2004 | Brophy et al. | | 257/98 |
| 6,819,464 B2* | 11/2004 | Fujimori et al. | | 359/246 |
| 7,036,574 B2* | 5/2006 | Thompson et al. | | 165/185 |
| 7,038,742 B2* | 5/2006 | Saitoh et al. | | 349/58 |
| 7,068,343 B2* | 6/2006 | Saitoh | | 349/158 |
| 7,119,863 B2* | 10/2006 | Seki et al. | | 349/114 |
| 7,275,851 B2* | 10/2007 | Sakurai | | 362/612 |
| 7,365,821 B2* | 4/2008 | Dewa et al. | | 349/161 |
| 7,580,090 B2* | 8/2009 | Choi | | 349/58 |
| 7,660,124 B2* | 2/2010 | Chen et al. | | 361/719 |
| 7,710,531 B2* | 5/2010 | Kurokawa et al. | | 349/161 |
| 7,839,464 B2* | 11/2010 | Lim | | 349/58 |
| 2002/0015119 A1* | 2/2002 | Takizawa | | 349/58 |
| 2002/0057419 A1* | 5/2002 | Fujimori et al. | | 353/53 |
| 2002/0131026 A1* | 9/2002 | Fujimori | | 353/119 |
| 2002/0135741 A1* | 9/2002 | Lee et al. | | 353/61 |
| 2003/0147036 A1* | 8/2003 | Kaise et al. | | 349/161 |
| 2004/0075870 A1* | 4/2004 | Karaki | | 358/296 |
| 2004/0125048 A1* | 7/2004 | Fukuda et al. | | 345/30 |
| 2004/0130897 A1* | 7/2004 | Kojima et al. | | 362/294 |
| 2004/0136146 A1* | 7/2004 | Saitoh et al. | | 361/600 |
| 2004/0160548 A1* | 8/2004 | Kojima et al. | | 349/58 |
| 2004/0165123 A1* | 8/2004 | Iguchi et al. | | 349/58 |
| 2004/0169784 A1* | 9/2004 | Miyashita et al. | | 349/58 |
| 2004/0246398 A1* | 12/2004 | Kojima et al. | | 349/58 |
| 2004/0252253 A1* | 12/2004 | Miyashita et al. | | 349/58 |
| 2005/0024834 A1* | 2/2005 | Newby | | 361/719 |
| 2005/0201670 A1* | 9/2005 | Uchiyama | | 385/14 |
| 2005/0237752 A1* | 10/2005 | Ono | | 362/373 |
| 2005/0270495 A1* | 12/2005 | Ohkubo et al. | | 353/54 |
| 2006/0001821 A1* | 1/2006 | Dewa et al. | | 349/150 |
| 2006/0012963 A1* | 1/2006 | Nishimura et al. | | 361/714 |
| 2006/0082697 A1* | 4/2006 | Saitoh et al. | | 349/58 |
| 2006/0098441 A1* | 5/2006 | Chou | | 362/294 |
| 2006/0196050 A1* | 9/2006 | Fujimori et al. | | 29/890.035 |
| 2006/0209248 A1* | 9/2006 | Shimada | | 349/158 |
| 2006/0221574 A1* | 10/2006 | Song et al. | | 361/704 |
| 2007/0054109 A1* | 3/2007 | Lin | | 428/316.6 |
| 2007/0195222 A1* | 8/2007 | Hirabayashi et al. | | 349/58 |
| 2007/0281223 A1* | 12/2007 | Mochizuki | | 430/5 |
| 2008/0019103 A1* | 1/2008 | Kim | | 361/720 |
| 2008/0023721 A1* | 1/2008 | Lee et al. | | 257/99 |
| 2008/0035938 A1* | 2/2008 | Mazzochette | | 257/89 |
| 2008/0055534 A1* | 3/2008 | Kawano | | 349/161 |
| 2008/0087911 A1* | 4/2008 | Stoyan | | 257/99 |
| 2008/0247168 A1* | 10/2008 | Chien et al. | | 362/294 |
| 2009/0080215 A1* | 3/2009 | Anandan | | 362/606 |
| 2009/0086038 A1* | 4/2009 | Karaki | | 348/208.7 |
| 2009/0146158 A1* | 6/2009 | Park | | 257/89 |
| 2009/0213548 A1* | 8/2009 | Kempers et al. | | 361/704 |
| 2010/0123850 A1* | 5/2010 | Miyashita | | 349/58 |
| 2010/0220256 A1* | 9/2010 | Hong | | 349/58 |
| 2011/0050657 A1* | 3/2011 | Yamada | | 345/204 |

FOREIGN PATENT DOCUMENTS

| | | |
|---|---|---|
| JP | 2005-134567 A | 5/2005 |
| JP | 2007-121505 A | 5/2007 |
| JP | 2007-199153 A | 8/2007 |
| JP | 2008-083424 A | 4/2008 |

* cited by examiner

ELECTRO-OPTIC DEVICE AND ELECTRONIC DEVICE

BACKGROUND

1. Technical Field

The present invention relates to a technical field of an electro-optic device such as, for example, a liquid crystal device, and an electronic device such as, for example, a liquid crystal projector including the electro-optic device.

2. Related Art

The electro-optic devices of this type include a reflective electro-optic panel that displays an image by modulating, for example, incident light by the pixel unit and then reflecting the light. There may be concern that due to the incidence of relatively intense light when performing the display, the electro-optic panel generates heat to thereby cause a remarkable rise in temperature. For this reason, for example, JP-A-2005-134567 discloses a technique that enables efficient heat emission by filling up a concave portion provided in a holding member that holds the electro-optic panel with a thermal conductivity filler.

However, in the above-mentioned technique, there is a technical problem of causing the complexity of a manufacturing process of the holding member and the increase in a manufacturing cost, since it is required to previously provide a concave portion for filling up the holding member with a thermal conductivity filler. Further, when each of the electro-optic panel and the holding member is expanded due to the heat, there is another problem concerning the electro-optic panel suffering from damage due to stress generated from the holding member.

SUMMARY

An advantage of some aspects of the invention is that it provides an electro-optic device and an electronic device capable of properly holding the electro-optic panel and performing efficient heat emission.

According to a first aspect of the invention, a first electro-optic device is provided, which includes: a reflective electro-optic panel that displays an image by reflecting incident light; a first holding member that holds the electro-optic panel so as to at least partly cover a lateral face of the electro-optic panel; and a second holding member having a heat emitting portion, adhered to a back surface of the electro-optic panel, that emits heat generated in the electro-optic panel. In the electro-optic device, a predetermined gap is provided between the first holding member and the second holding member.

According to the first electro-optic device of the invention, at the time of operation thereof, light is illuminated from a light source such as, for example, a white color lamp with respect to the electro-optic panel. The electro-optic panel displays an image by modulating light incident on a display surface by the pixel unit, and then reflecting the light from a reflective film such as an Al (aluminum) film. Each pixel is disposed at, for example, the display surface in a matrix form, and is electrically connected to a scanning line for supplying a scanning signal and a data line for supplying an image signal, respectively. Each pixel controls electro-optic materials such as liquid crystals which are oppositely disposed, in response to a potential of the image signal.

The electro-optic panel of the invention is held by the first holding member that at least partly covers the lateral face thereof. The electro-optic panel is adhered to the first holding member in, for example, a display surface and the like that displays an image. Meanwhile, the "lateral face" termed here means a surface located between the display surface and the back surface located oppositely to the display surface. In addition, the "adhesion" termed here includes adhesion with an adhesive and the like, and also includes fixation with a screw and the like. Further, the adhesion not only includes a case of completely fixed, but also includes a state where members are tightly contacted with each other by, for example, grease and the like.

The first holding member, typically, holds and protects the electro-optic panel, and also functions as a restraint member that restricts light incident on the electro-optic panel by including a material having a light-shielding property.

Further, the electro-optic panel is held by the second holding member adhered to the back surface located at the opposite side of the display surface. The second holding member has a heat emitting portion that emits heat generated in the electro-optic panel to the outside of the device. The heat emitting portion forms a structure that includes, for example, a highly heat-conductive material and has a large surface area. In addition, the heat emitting portion may include a heat-emitting fin. Since it is possible to efficiently emit heat generated in the electro-optic panel at the time of operation by being equipped with the heat emitting portion, reliability of the device can be raised.

Particularly in the invention, a predetermined gap is provided between the above-mentioned first holding member and the second holding member. That is, the first holding member and the second holding member are disposed so as not to be in contact with each other.

It is possible to prevent the electro-optic panel from suffering from damage due to stress generated from the first holding member and the second holding member, by providing the predetermined gap, in the case where each of the electro-optic panel, the first holding member and the second holding member is thermally expanded due to, for example, heat emission and the like at the time of operation. In particular, it is possible to prevent the electro-optic panel from being compressed by expansion of the first holding member and the second holding member, or to prevent a load from being applied to the adhesion portion of the first holding member and the second holding member and the electro-optic panel due to the different coefficient of thermal expansion of each member.

It is preferable that, from the reason as described above, the predetermined gap is set on the basis of the size and the coefficient of thermal expansion of each member. That is, even when the thermal expansion is generated, for instance, it is preferable that a gap to a degree that the stress generated from the first holding member and the second holding member is not applied is set with respect to the electro-optic panel. Meanwhile, a place in which the predetermined gap is not partly provided may exist. In other words, a place in which the first holding member and the second holding member are partly in contact with each other may exist.

As described above, according to the first electro-optic device of the invention, it is possible to properly hold the electro-optic panel and to perform efficient heat emission.

According to a second aspect of the invention, a second electro-optic device is provided, which includes: a reflective electro-optic panel that includes a display surface for displaying an image by reflecting incident light, a back surface located at the opposite side of the display surface, and a lateral face located between the display surface and the back surface; a first holding member that holds the electro-optic panel by being adhered to the display surface with respect to the electro-optic panel; and a second holding member, adhered to the back surface with respect to the electro-optic panel, that holds the electro-optic panel by at least partly covering the lateral face, and has a heat emitting portion for emitting heat generated in the electro-optic panel. In the second electro-optic device, a predetermined gap is provided between the first holding member and the second holding member.

According to the second electro-optic device of the invention, at the time of operation thereof, light is illuminated from a light source such as, for example, a white color lamp with respect to the electro-optic panel. The electro-optic panel displays an image by modulating light incident on the display surface by the pixel unit and reflecting the light.

The electro-optic panel is held by the first holding member adhered to the display surface thereof. The first holding member, typically, holds and protects the electro-optic panel, and also functions as a restraint member that restricts light incident on the electro-optic panel by including a material having a light-shielding property.

Further, the electro-optic panel is held by the second holding member that is adhered to the back surface of the panel located at the opposite side of the display surface thereof, and at least partly covers the lateral face thereof. The second holding member has a heat emitting portion that emits heat generated in the electro-optic panel to the outside of the device. Since it is possible to efficiently emit heat generated in the electro-optic panel at the time of operation by being equipped with the heat emitting portion, reliability of the device can be raised.

Particularly in the invention, a predetermined gap is provided between the above-mentioned first holding member and the second holding member. That is, the first holding member and the second holding member are disposed so as not to be in contact with each other. It is possible to prevent the electro-optic panel from suffering from damage due to stress generated from the first holding member and the second holding member, by providing the predetermined gap, in the case where each of the electro-optic panel, the first holding member and the second holding member is thermally expanded due to, for example, heat emission and the like at the time of operation.

It is preferable that, from the reason as described above, the predetermined gap is set on the basis of the size and the coefficient of thermal expansion of each member. That is, even when the thermal expansion is generated, for instance, it is preferable that a gap to a degree that the stress generated from the first holding member and the second holding member is not applied is set with respect to the electro-optic panel. Meanwhile, a place in which the predetermined gap is not partly provided may exist. In other words, a place in which the first holding member and the second holding member are partly in contact with each other may exist.

As described above, according to the second electro-optic device of the invention, it is possible to properly hold the electro-optic panel and to perform efficient heat emission.

In one embodiment of the first electro-optic device of the invention, the first holding member is adhered to the lateral face with respect to the electro-optic panel.

According to the embodiment, since the first holding member is adhered to the lateral face of the electro-optic panel, it is possible to more solidly hold the electro-optic panel. On the other hand, as the number of the adhesion places of the electro-optic panel and the first holding member is increased, the possibility that a load applied to the electro-optic panel occurs is also increased with the thermal expansion and the like. However, in the above-mentioned embodiment, since the predetermined gap is provided between the first holding member and the second holding member as described above, it is possible to properly prevent damage to the electro-optic panel due to stress from being generated.

In one embodiment of the second electro-optic device of the invention, the second holding member is adhered to the lateral face with respect to the electro-optic panel.

According to the embodiment, since the second holding member is adhered to the lateral face of the electro-optic panel, it is possible to more solidly hold the electro-optic panel. On the other hand, as the number of the adhesion places of the electro-optic panel and the second holding member is increased, the possibility that a load applied to the electro-optic panel occurs is also increased with the thermal expansion and the like. However, in the above-mentioned embodiment, since the predetermined gap is provided between the first holding member and the second holding member as described above, it is possible to properly prevent damage to the electro-optic panel due to stress from being generated.

In another embodiment of the electro-optic device of the invention, the predetermined gap is filled up with a filler having a thermal conductivity.

According to the embodiment, since the predetermined gap is filled up with a filler having a thermal conductivity such as, for example, grease, it is possible to more efficiently transfer heat generated in the electro-optic panel to the heat emitting portion in the second holding member. Therefore, reliability of the device can be raised. In addition, supposing that the filler has fluidity, it is possible to disperse the stress due to the thermal expansion and the like, and to diminish damage to the electro-optic panel.

According to another embodiment of the electro-optic device of the invention, the first holding member and the second holding member include materials of which the coefficients of thermal expansion are different from each other.

According to the embodiment, since the first holding member and the second holding member include materials of which the coefficients of thermal expansion are different from each other, the first holding member and the second holding member are expanded at different ratios, respectively, at the time of thermal expansion and the like. Consequently, damage to the electro-optic panel is easy to be generated.

However, in the above-mentioned embodiment, since the predetermined gap is provided between the first holding member and the second holding member as described above, it is possible to properly prevent damage to the electro-optic panel due to stress from being generated.

In the embodiment where the first holding member and the second holding member as mentioned above include materials of which the coefficients of thermal expansion are different from each other, the first holding member may be configured to include a material having a lower coefficient of thermal expansion than that of the second holding member.

In this case, since the first holding member includes a material having a lower coefficient of thermal expansion than that of the second holding member, it is possible to make the coefficient of thermal expansion of the first holding member close to the coefficient of thermal expansion of the electro-optic panel that includes a material having a relatively low coefficient of thermal expansion such as, for example, quartz and the like.

The first holding member, typically, is adhered with respect to the electro-optic panel more solidly than the second holding member. In particular, the first holding member is fixed to the electro-optic panel by a screw and the like in addition to an adhesive and the like. For this reason, the first holding member has a higher possibility that stress is applied with respect to the electro-optic panel than the second holding member at the time of thermal expansion and the like. Therefore, it is possible to effectively diminish damage to the electro-optic panel due to the stress by making the coefficient of thermal expansion of the first holding member close to the coefficient of thermal expansion of the electro-optic panel.

According to a third aspect of the invention, an electronic device including the above-mentioned electro-optic device (also including various types of forms thereof) of the invention is provided.

According to the electronic device of the invention, since the above-mentioned electro-optic device of the invention is included, it is possible to realize various types of electronic devices such as projection-type display devices having high reliability, televisions, cellular phones, electronic diaries, word processors, viewfinder type or monitor direct-view-type video tape recorders, workstations, television telephones, POS terminals, touch panels. In addition, it is also possible to realize electrophoresis apparatuses such as, for example, electronic paper as the electronic device of the invention.

Operations and the other advantages of the invention are made clear from embodiments for carrying out the invention to be described below.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to the drawings.
Electro-optic Panel
First, reference is made to FIG. 1 to FIG. 3 to describe a reflective electro-optic panel included in the electro-optic device according to the embodiment. In the following embodiment, a driver circuit built-in TFT (Thin Film Transistor) active matrix driven liquid crystal device is taken as an example.

The whole configuration of the electro-optic panel according to the embodiment will be described with reference to FIG. 1 and FIG. 2. Here, FIG. 1 is a plan view illustrating the whole configuration of the electro-optic panel according to the embodiment, and FIG. 2 is a cross-section view taken along the II-II' line of FIG. 1.

Figure 1:
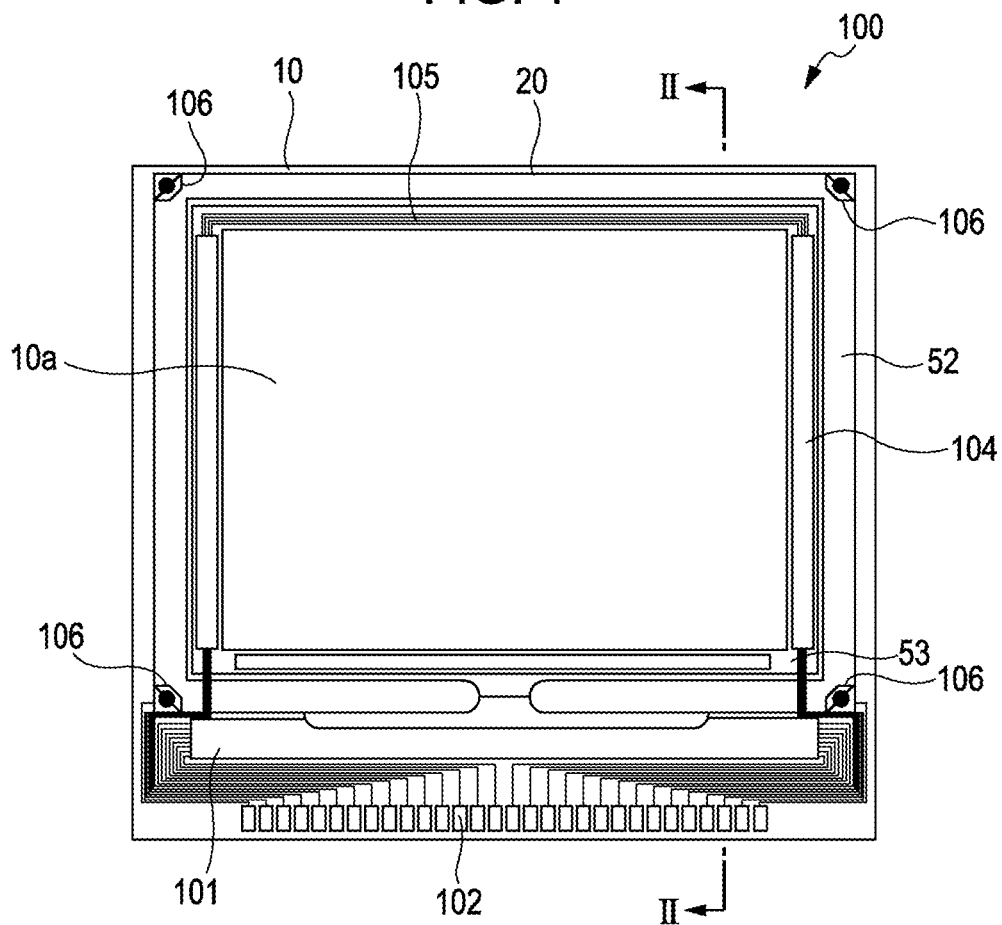
FIG. 1 is a plan view illustrating the whole configuration of an electro-optic panel according to an embodiment.
Figure 2:
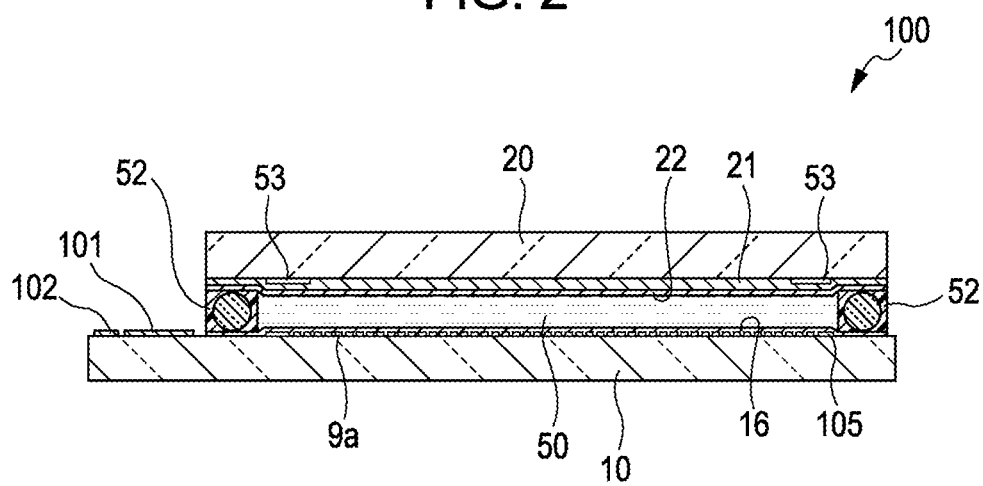
FIG. 2 is a cross-section view taken along the II-II' line of FIG. 1.

In FIG. 1 and FIG. 2, a TFT array substrate 10 and an opposite substrate 20 are oppositely disposed in an electro-optic panel 100 according to the embodiment. The TFT array substrate 10 is a transparent substrate such as, for example, a quartz substrate and a glass substrate, or a silicon substrate and the like. The opposite substrate 20 is a transparent substrate such as, for example, a quartz substrate and a glass substrate. A liquid crystal layer 50 is sealed between the TFT array substrate 10 and the opposite substrate 20. The liquid crystal layer 50 is composed of, for example, liquid crystals in which a kind or several kinds of nematic liquid crystals are mixed, and takes a predetermined orientation state between a pair of oriented films.

The TFT array substrate 10 and the opposite substrate 20 are adhered to each other by a seal material 52 which is provided in a seal region located at the periphery of an image display region 10a provided with a plurality of pixel electrodes.

The seal material 52 is composed of, for example, ultraviolet-curing resin, thermosetting resin and the like for bonding both substrates together, and is a material which is applied in the TFT array substrate 10 in a manufacturing process, and then is cured by ultraviolet irradiation, heating and the like. A gap material such as fiberglass or glass beads for setting an interval (that is, inter-substrate gap) of the TFT array substrate 10 and the opposite substrate 20 to a predetermined value is scattered in the seal material 52. Meanwhile, the gap material may be disposed in the peripheral region located at the image display region 10a or the periphery of the image display region 10a, in addition to mixing the gap material in the seal material 52 or instead of it.

A frame light-shielding film 53 of an opacity defining a frame region of the image display region 10a is provided in the opposite substrate 20 side in parallel to the inner side of a seal region in which the seal material 52 is disposed. Meanwhile, all or a portion of this type of frame light-shielding film 53 may be provided in the TFT array substrate 10 side as a built-in light-shielding film.

In a region located at the outer side of the seal region in which the seal material 52 is disposed among the peripheral regions, a data line driving circuit 101 and an external circuit connecting terminal 102 are provided along one side of the TFT array substrate 10. Scanning line driving circuits 104 are provided so as to be along two sides adjacent to this one side and to be covered by the frame light-shielding film 53. Further, for the purpose of linking two scanning line driving circuits 104 together provided in both sides of the image display region 10a as just described, a plurality of interconnections 105 is provided so as to be along the remaining one side of the TFT array substrate 10 and to be covered by the frame light-shielding film 53.

Vertical conduction terminals 106 for connecting both substrates with vertical conduction materials 107 are disposed in regions opposite to four corners of the opposite substrate 20 on the TFT array substrate 10. Through these, electricity can be conducted between the TFT array substrate 10 and the opposite substrate 20.

In FIG. 2, on the TFT array substrate 10 is formed a laminated structure in which pixel switching TFTs serving as driving elements, or interconnections such as scanning lines and data lines are formed. Although the detailed configuration of this laminated structure is not shown in FIG. 2, a reflective pixel electrode 9a serving as a reflective electrode is provided on this laminated structure. The pixel electrode 9a is typically formed in an island shape in a predetermined pattern for each pixel by light reflective materials such as aluminum, and is formed so as to be capable of reflecting incident light.

The pixel electrode 9a is formed in the image display region 10a on the TFT array substrate 10 so as to be opposite to the opposite electrode 21. On a surface of the side facing the liquid crystal layer 50 in the TFT array substrate 10, that is, on the pixel electrode 9a, an oriented film 16 is formed so as to cover the pixel electrode 9a.

On an opposite surface to the TFT array substrate 10 in the opposite substrate 20, the opposite electrode 21 composed of transparent materials such as ITO is formed so as to be opposite to a plurality of pixel electrodes 9a. In addition, a color filter which is not shown in FIG. 2 may be formed, in order to perform color display in the image display region 10a. An oriented film 22 is formed on the opposite electrode 21 on the opposite surface of the opposite substrate 20. Meanwhile, similarly to a transmissive liquid crystal device, a light-shielding film may be formed on the opposite substrate 20 in a lattice shape or a stripe shape, and a non-aperture region may be provided thereon.

Meanwhile, a sampling circuit that samples an image signal on an image signal line to supply it to the data line, a precharge circuit that supplies precharge signals of a predetermined voltage level, respectively, to a plurality of data lines ahead of the image signal, an inspection circuit that inspects the quality, defects and the like of the electro-optic panel 100 during manufacturing or at the time of shipment, and the like may be formed on the TFT array substrate 10 shown in FIG. 1 and FIG. 2, in addition to the driving circuit such as the above-mentioned data line driving circuit 101 and the scanning line driving circuit 104.

Figure 3:
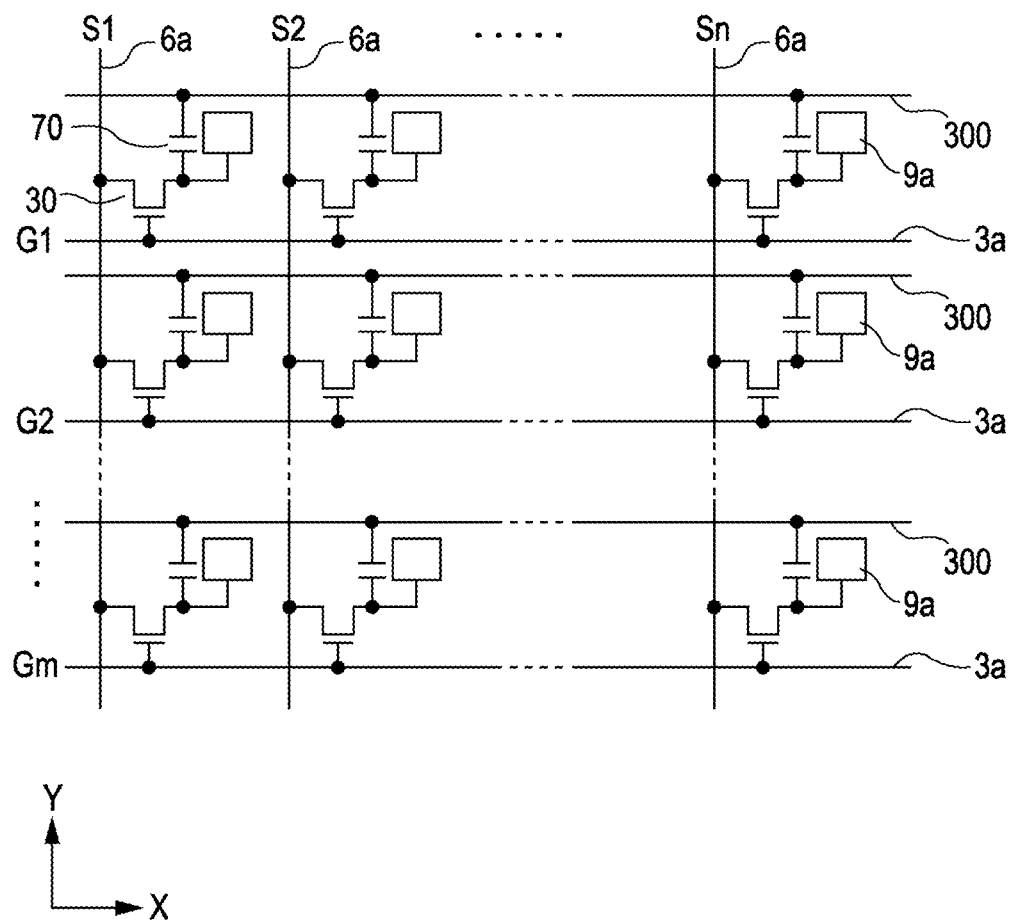
FIG. 3 is an equivalent circuit diagram of various types of elements, interconnections and the like in a plurality of pixels formed in a matrix form which constitutes an image display region of the electro-optic panel according to the embodiment.

Next, reference is made to FIG. 3 to describe the electrical configuration of a pixel portion of the electro-optic panel according to the embodiment. Here, FIG. 3 is an equivalent circuit diagram of various types of elements, interconnections and the like in a plurality of pixels formed in a matrix form which constitutes an image display region of the electro-optic panel according to the embodiment.

In FIG. 3, the pixel electrodes 9a and TFTs 30 are formed in a plurality of each of the pixels formed in a matrix form which constitutes the image display region 10a. The TFT 30 is electrically connected to the pixel electrode 9a, and controls switching of the pixel electrode 9a at the time of operation of the electro-optic panel 100 according to the embodiment. A data line 6a to which the image signal is supplied is electrically connected to sources of the TFTs 30. The image signals S1, S2, . . . , Sn written in the data line 6a may be line-sequentially supplied in this order, and may be supplied for each group with respect to a plurality of data lines 6a adjacent to each other.

A scanning line 3a is electrically connected to gates of the TFTs 30, and the electro-optic panel 100 according to the embodiment is configured so that at a predetermined timing, scanning signals G1, G2, . . . , Gm are line-sequentially applied to the scanning line 3a in this order in a pulse manner. The pixel electrode 9a is electrically connected to a drain of the TFT 30, and the image signals S1, S2, . . . , Sn to be supplied from the data line 6a are written at a predetermined timing by closing a switch of the TFT 30 serving as a switching element for a certain period. The image signals S1, S2, . . . , Sn having a predetermined level, written in liquid crystals as an example of the electro-optic material via the pixel electrode 9a, are held for a certain period between the opposite electrode formed on the opposite substrate and the pixel electrode.

The liquid crystals constituting the liquid crystal layer 50 (see FIG. 2) change in orientation or order of molecular assembly due to the voltage level to be applied, which causes light to be modulated, thereby allowing grayscale display. For example, in a normally white mode, the transmittance of incident light is reduced in response to a voltage applied in units of each of the pixels, and in a normally black mode, the transmittance of incident light is increased in response to a voltage applied in units of each of the pixels. Therefore, as a whole, light having a contrast corresponding to the image signal is emitted from the electro-optic panel 100.

Here, a storage capacitor 70 is added in parallel with a liquid crystal capacitor formed between the pixel electrode 9a and the opposite electrode 21 (see FIG. 2) in order to prevent the held image signal from being leaked. The storage capacitor 70 is a capacitive element functioning as a holding capacitor that temporarily holds a potential of each pixel electrode 9a in accordance with the supply of the image signal. One electrode of the storage capacitor 70 is electrically connected to the drain of the TFT 30 in parallel with the pixel electrode 9a, and the other electrode thereof is electrically connected to a potential fixed capacitive line 300 so as to become a constant potential. According to the storage capacitor 70, the potential holding characteristics in the pixel electrode 9a can be improved, and the display characteristics of improvement in contrast or reduction in flicker can be improved.

Electro-optic Device

Next, the electro-optic device including the above-mentioned electro-optic panel 100 will be described with reference to FIG. 4 to FIG. 7.

First Embodiment

First, the electro-optic device according to the first embodiment will be described with reference to FIG. 4 and FIG. 5. Here, FIG. 4 is a perspective view illustrating the whole configuration of the electro-optic device according to the first embodiment, and FIG. 5 is a cross-section view illustrating the specific configuration of the electro-optic device according to the first embodiment.

Figure 4:
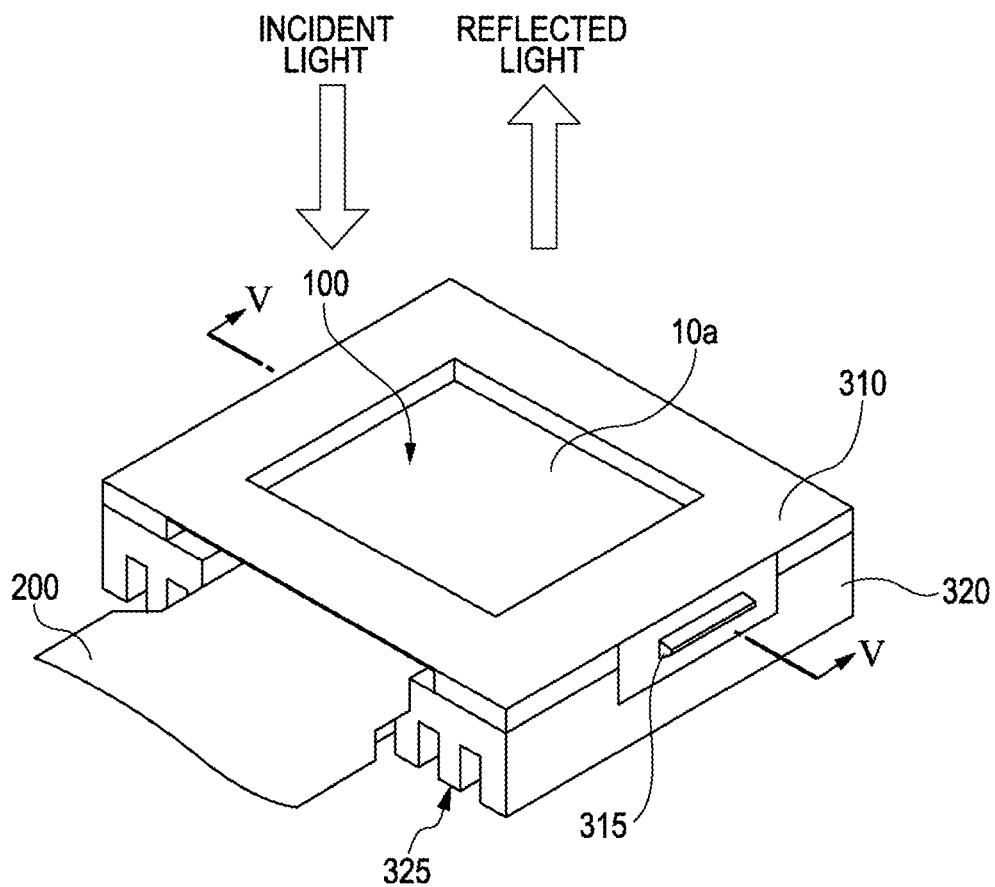
FIG. 4 is a perspective view illustrating the whole configuration of an electro-optic device according to a first embodiment.
Figure 5:
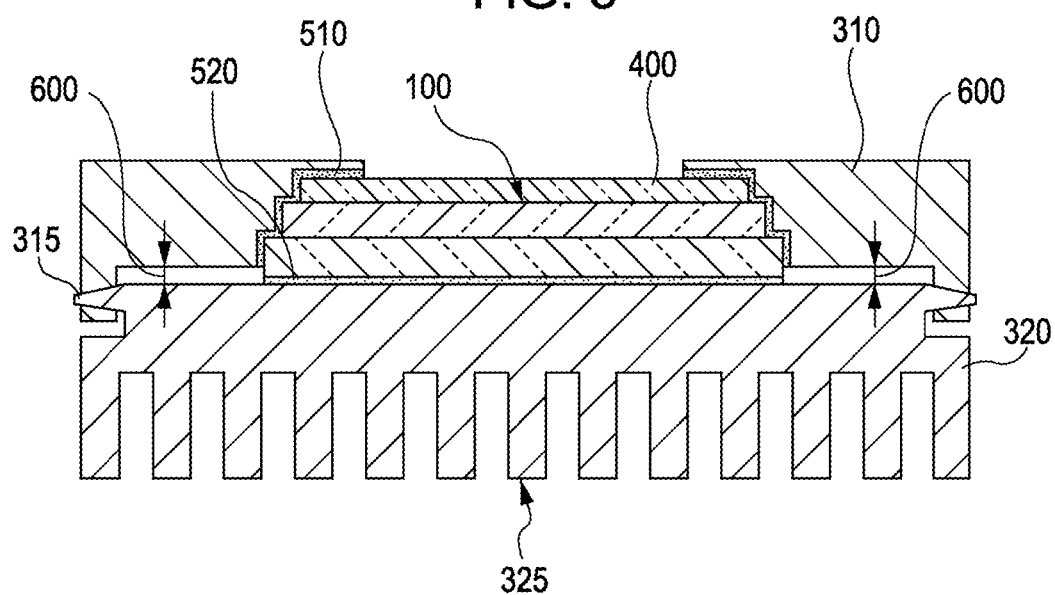
FIG. 5 is a cross-section view illustrating the specific configuration of the electro-optic device according to the first embodiment.

In FIG. 4, the electro-optic device according to the embodiment includes the electro-optic panel 100, a frame 310, and a heat sink 320.

The flexible substrate 200 including signal interconnections for sending various control signals is electrically connected to the electro-optic panel 100. The flexible substrate 200 is formed by patterning of the signal interconnections and the like in, for example, a base material such as polyimide. Meanwhile, a driving IC chip and the like including at least a portion of a driver circuit for driving the electro-optic panel 100 may be disposed on the flexible substrate 200. The flexible substrate 200 is configured so that one end on the side opposite to the other end connected to the electro-optic panel 100 is drawn on the outer side of the frame 310 and the heat sink 320, and is connected to an external circuit (not shown).

The frame 310 is an example of the "first holding member" of the invention, and holds the electro-optic panel 100 from the display surface side providing the image display region 10a. The frame 310 not only functions as a holding member that holds the electro-optic panel 100, but also functions as a restraint member that restricts light incident on the electro-optic panel 100. The frame 310 includes a metal such as, for example, iron, copper, and aluminum. However, in order to diminish stress at the time of thermal expansion as described later, it is preferable that the frame is composed of materials having a coefficient of thermal expansion approximate to quartz and the like which is a material making up the electro-optic panel 100. That is, it is preferable that the frame is composed of a material having a relatively low coefficient of thermal expansion.

The heat sink 320 is an example of the "second holding member" of the invention, and holds the electro-optic panel 100 from the back side located at the opposite side of the display surface. The heat sink 320 has a heat emitting portion 325 for emitting heat generated in the electro-optic panel 100. Hereby, it is possible to reduce the generation of defect by the heat in the electro-optic panel 100. That is, it is possible to raise reliability of the device. The heat sink 320 preferably includes highly heat-conductive materials in order to raise the effect of heat emission.

The frame 310 and the heat sink 320 are joined to each other in a joint portion 315. Although the joining here is typically performed by fitting a convex portion provided in the heat sink 320 into a concave portion provided in the frame 310, it may be performed by using an adhesive or a screw and the like.

In FIG. 5, the electro-optic panel 100 and the frame 310 are adhered to each other by an adhesive 510. The adhesive 510 is provided from the surface of the electro-optic panel 100 to the lateral face thereof. Meanwhile, a dustproof glass 400 is bonded to the display surface of the electro-optic panel 100 as an example of a dustproof substrate. In addition, a member other than the dustproof glass 400 may be provided in the electro-optic panel 100.

The electro-optic panel 100 and the heat sink 320 are adhered to each other by grease 520 which is composed of thermal conductivity materials. The grease 520 has a relatively high thermal conductivity, and can efficiently transfer the heat generated in the electro-optic panel 100 to the heat sink 320. Thus, it is possible to raise the effect of heat emission in the heat emitting portion 325.

Particularly in the electro-optic device according to the embodiment, a predetermined gap 600 is provided between the frame 310 and the heat sink 320. The predetermined gap 600 is provided in the whole portion where the frame 310 and the heat sink 320 are opposite to each other except the joint 315. In other words, the frame 310 and the heat sink 320 are configured not to be in contact with each other at a place other than the joint 315. That is, the opposite surfaces of the frame 310 and the heat sink 320 are respectively disposed separately to each other via an air layer.

It is possible to prevent the electro-optic panel 100 from suffering from damage due to stress generated from the frame 310 and the heat sink 320, by providing the predetermined gap 600, in the case where each of the electro-optic panel 100, the frame 310 and the heat sink 320 is thermally expanded due to, for example, heat emission and the like at the time of operation of the device. In particular, it is possible to prevent the electro-optic panel 100 from be compressed by expansion of the frame 310 and the heat sink 320, or to prevent a load from being applied to the adhesion portion of the frame 310 and the heat sink 320 and the electro-optic panel 100 due to the different coefficient of thermal expansion of each member.

It is preferable that, from the reason as described above, the predetermined gap 600 is set on the basis of the size and the coefficient of thermal expansion of each member. That is, even when the thermal expansion is generated, for instance, it is preferable that a gap to a degree that the stress generated from the frame 310 and the heat sink 320 is not applied is set with respect to the electro-optic panel 100.

As described above, according to the electro-optic device of the first embodiment, it is possible to properly hold the electro-optic panel and to perform efficient heat emission.

Second Embodiment

Figure 6:
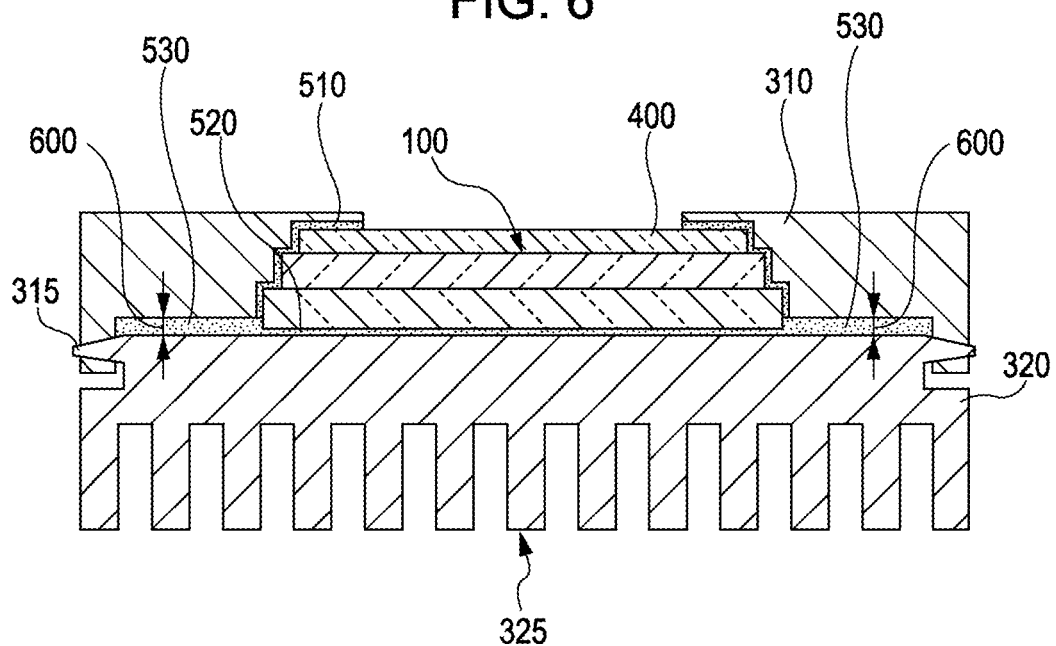
FIG. 6 is a cross-section view illustrating the specific configuration of the electro-optic device according to a second embodiment.

Next, the electro-optic device according to the second embodiment will be described with reference to FIG. 6. Here, FIG. 6 is a cross-section view illustrating the specific configuration of the electro-optic device according to the second embodiment. Meanwhile, the second embodiment is different in some configurations from the first embodiment mentioned above, but is generally the same as the first embodiment in other configurations. For this reason, in the second embodiment, the portions different from those of the first embodiment will be described in detail, and description of other repeated portions is properly omitted.

In FIG. 6, in the electro-optic device according to the second embodiment, the predetermined gap 600 provided between the frame 310 and the heat sink 320 is filled up with grease 530.

The grease 530 is an example of a "filler" of the invention, and includes a relatively highly heat-conductive material. The predetermined gap 600 is filled up with the grease 530, so that it is possible to efficiently transfer heat of the frame 310 to the heat sink 320. Therefore, it is possible to efficiently transfer the heat, transferred from the electro-optic panel 100 to the frame 310, to the heat sink 320. Accordingly, the effect of heat emission in the heat emitting portion 325 can be further raised.

Meanwhile, the grease 530 exhibits the effect even by partly filling up the predetermined gap 600. That is, even though the whole predetermined gap 600 is not filled up with the grease 530, the effect of heat emission in the heat emitting portion 325 can be raised.

As described above, according to the electro-optic device according to the second embodiment, the higher effect of heat emission can be obtained compared to the first embodiment mentioned above.

Third Embodiment

Figure 7:
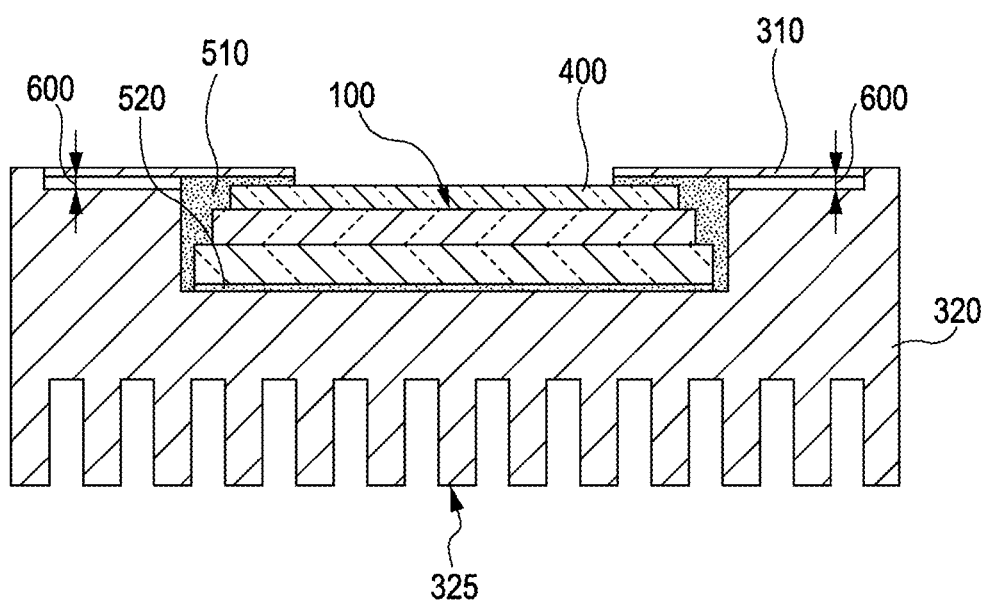
FIG. 7 is a cross-section view illustrating the specific configuration of the electro-optic device according to a third embodiment.

Next, the electro-optic device according to the third embodiment will be described with reference to FIG. 7. Here, FIG. 7 is a cross-section view illustrating the specific configuration of the electro-optic device according to the third embodiment. Meanwhile, the third embodiment is different in some configurations from the first embodiment mentioned above, but is generally the same as the first embodiment in other configurations. For this reason, in the third embodiment, the portions different from those of the first embodiment will be described in detail, and description of other repeated portions is appropriately omitted.

In FIG. 7, in the electro-optic device according to the third embodiment, the heat sink 320 is extended up to a position in which the lateral face of the electro-optic panel 100 is covered. For this reason, the electro-optic panel 100 is adhered to the frame 310 in the display surface thereof, and is adhered to the heat sink 320 in the lateral face and the back surface thereof.

In the third embodiment, similarly to the first and second embodiments described above, the predetermined gap 600 is also provided between the frame 310 and the heat sink 320. Therefore, it is possible to prevent the electro-optic panel 100 from suffering from damage due to stress generated from the frame 310 and the heat sink 320, in the case where each of the electro-optic panel 100, the frame 310 and the heat sink 320 is thermally expanded due to heat emission and the like at the time of operation of the device.

As described above, according to the electro-optic device of the third embodiment, similarly to the first embodiment mentioned above, it is possible to properly hold the electro-optic panel and to perform efficient heat emission.

Electronic Device

Figure 8:
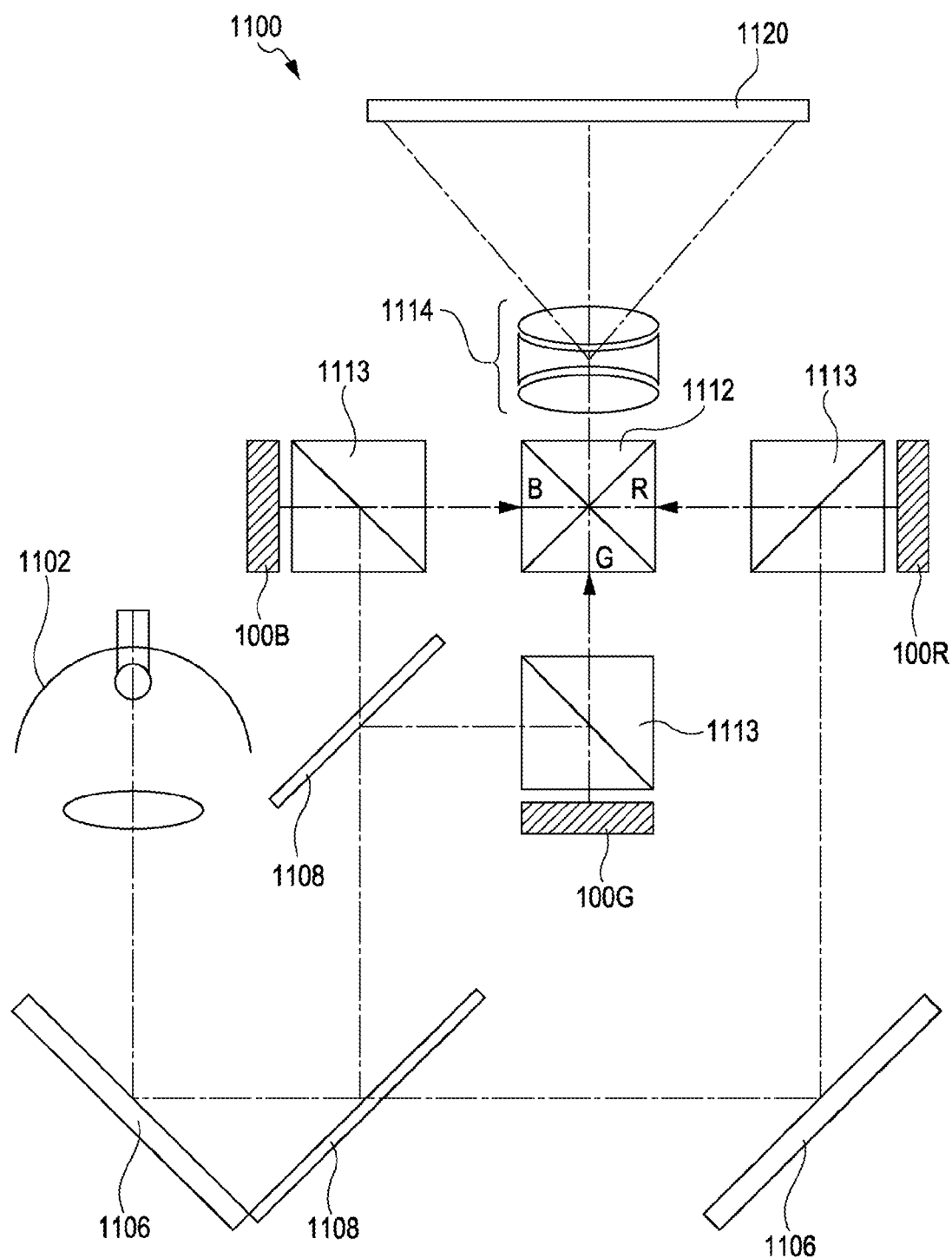
FIG. 8 is a plan view illustrating the configuration of a projector which is an example of an electronic device to which the electro-optic device is applied.

Next, a case where the liquid crystal device serving as the above-mentioned electro-optic device is applied to various types of electronic devices will be described. Herein, the electronic device according to the invention includes a projection-type liquid crystal projector as an example. FIG. 8 is a schematic cross-section view of the projection-type liquid crystal projector according to the embodiment.

In FIG. 8, a liquid crystal projector 1100 according to the embodiment is constructed as a double-plate type color projector in which three liquid crystal light valves 100R, 100G and 100B for RGB are used. Each of the liquid crystal light valves 100R, 100G and 100B uses the above-mentioned reflective liquid crystal device.

As shown in FIG. 6, in the liquid crystal projector 1100, when projection light is emitted from a lamp unit 1102 of a white light source such as a metal halide lamp, the projection light is divided into optical components R, G and B corresponding to three primary colors of RGB by two mirrors 1106, two dichroic mirrors 1108 and three polarizing beam splitters (PBS) 1113, and is guided to the liquid crystal light valves 100R, 100G and 100B corresponding to each of the colors, respectively. At this time, in order to prevent a light loss in a light path, a lens may be properly provided in the light path. The optical components corresponding to three primary colors modulated respectively by the liquid crystal light valves 100R, 100G and 100B are synthesized by a cross prism 1112, and then are projected to a screen 1120 via a projection lens 1114 as color images.

Meanwhile, since the light corresponding to each of the primary colors of R, G and B is incident on the liquid crystal light valves 100R, 100B and 100G through the dichroic mirrors 1108 and the polarizing beam splitters 1113, it is not necessary to provide a color filter.

In addition to the electronic devices described with reference to FIG. 8, included are mobile-type personal computers, cellular phones, liquid crystal televisions, viewfinder-type or monitor direct-view-type video tape recorders, car navigation devices, pagers, electronic diaries, calculators, word processors, workstations, television telephones, POS terminals, devices equipped with touch panels, and the like. Further, it goes without saying that the electro-optic device according to the invention can be applied to various types of these electronic devices.

In addition to the reflective liquid crystal device described in the above-mentioned embodiment, the invention can be also applied to transmissive liquid crystal devices, plasma displays (PDP), electrolytic emitting displays (FED, SED), organic EL displays, digital micro-mirror devices (DMD), electrophoresis apparatuses, and the like.

The invention is not limited to the above-mentioned embodiment, but may be suitably modified within a range without departing from the gist or the spirit of the invention readable from the scope of claims and the whole specification of the invention. Furthermore, the electro-optic devices and the electronic devices including such electro-optic devices, which are associated with such modification, are also included in the technical scope of the invention.

What is claimed is:

1. An electro-optic device comprising:
    an electro-optic panel having an image display region through which incident light travels in an incident light direction;
    a first holding member that holds the electro-optic panel, the first holding member including a surface portion that at least partly covers and extends substantially parallel to a lateral face of the electro-optic panel; and
    a second holding member provided with a heat emitting portion on the side opposite to a surface of the second holding member to which the electro-optic panel is adhered, the heat emitting portion overlapping pixel electrodes in at least a part of the image display region in the incident light direction,
    wherein
        the first holding member and the second holding member include materials having different coefficients of thermal expansion,
        the first holding member and the second holding member are joined at a joint portion such that the first holding member and the second holding member are not in contact with each other at a place other than the joint portion, and
        a predetermined gap is provided between the first holding member and the second holding member in the incident light direction, the predetermined gap being set on a basis of the coefficients of thermal expansion of the first holding member and the second holding member, the predetermined gap extending laterally between the lateral face of the electro-optic panel and the joint portion, the predetermined gap having a thickness that is less than the thickness of the electro-optic panel in the incident light direction.

2. The electro-optic device according to claim 1, wherein the first holding member is adhered to a portion of a dustproof substrate bonded to a display surface of the electro-optic panel.

3. The electro-optic device according to claim 1, wherein the first holding member is adhered to the lateral face of the electro-optic panel.

4. The electro-optic device according to claim 2, wherein the second holding member is adhered to the lateral face of the electro-optic panel.

5. The electro-optic device according to claim 1, wherein a filler having a thermal conductivity is disposed within the predetermined gap, the filler extending from the first holding member to the second holding member.

6. The electro-optic device according to claim 1, wherein the first holding member includes a material having a lower coefficient of thermal expansion than that of the second holding member.

7. An electronic device comprising the electro-optic device according to claim 1.

8. The electro-optic device according to claim 1, wherein the predetermined gap is provided between the first holding member and the surface of the second holding member to which the electro-optic panel is adhered.

9. The electro-optic device according to claim 8, wherein the electro-optic panel comprises a reflective electro-optic panel that displays an image by reflecting incident light.

10. The electro-optic device according to claim 1, wherein the electro-optic panel is directly adhered to at least one of:
    the second holding member, and
    a dustproof glass directly adhered to the second holding member.

11. The electro-optic device according to claim 10, wherein the first holding member and the second holding member are joined in the joint portion by fitting a convex portion provided in the second holding member into a concave portion provided in the first holding member.

12. The electro-optic device according to claim 11, wherein the electro-optic panel is fitted into one of plural grooves in a step pattern provided in the first holding member.

13. An electro-optic device comprising:
an electro-optic panel through which incident light travels in an incident light direction;
a first holding member arranged so as to accommodate the electro-optic panel, the first holding member including a surface portion that faces and extends substantially parallel to a lateral face of the electro-optic panel; and
a second holding member provided with a heat emitting portion on the side opposite to a surface of the second holding member to which the electro-optic panel is adhered,
wherein
the first holding member and the second holding member include materials having different coefficients of thermal expansion,
the first holding member and the second holding member are joined at a joint portion such that the first holding member and the second holding member are not in contact with each other at a place other than the joint portion, and
a predetermined gap is provided between the first holding member and the second holding member in the incident light direction, the predetermined gap being set on a basis of the coefficients of thermal expansion of the first holding member and the second holding member, the predetermined gap extending laterally between the lateral face of the electro-optic panel and the joint portion, the predetermined gap having a thickness that is less than the thickness of the electro-optic panel in the incident light direction.

14. An electro-optic device comprising:
a reflective electro-optic panel having a first surface, a second surface located at an opposite side of the first surface and a side surface located between the first surface and the second surface;
a first holding member adhered to a part of the side surface of the reflective electro-optic panel, the first holding member including a surface portion that faces and extends substantially parallel to the part of the side surface of the reflective electro-optic panel; and
a second holding member adhered to the second surface of the reflective electro-optic panel,
wherein
the first holding member includes a material having a lower coefficient of thermal expansion than a coefficient of thermal expansion of the second holding member,
the first holding member and the second holding member are joined at a joint portion such that the first holding member and the second holding member are not in contact with each other at a place other than the joint portion, and
a predetermined gap is provided between the first holding member and the second holding member, the predetermined gap extending along the side surface of the electro-optic panel, the predetermined gap having a thickness that is less than the thickness of the reflective electro-optic panel in an incident light direction in which incident light travels through the electro-optic panel.

15. The electro-optic device according to claim 1, wherein an air layer is disposed within the predetermined gap, the air layer extending from the first holding member to the second holding member in the incident light direction.

16. The electro-optic device according to claim 1, wherein the heat emitting portion comprises a heat-emitting fin overlapping the pixel electrodes in the incident light direction.

17. The electro-optic device according to claim 5, wherein the filler comprises grease.

* * * * *